(12) United States Patent
Marfeld et al.

(10) Patent No.: US 8,546,826 B2
(45) Date of Patent: Oct. 1, 2013

(54) LIGHT-EMITTING MODULE AND METHOD OF MANUFACTURE FOR A LIGHT-EMITTING MODULE

(75) Inventors: Jan Marfeld, Regensburg (DE); Walter Wegleiter, Nittendorf (DE); Moritz Engl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 89 days.

(21) Appl. No.: 12/529,137

(22) PCT Filed: Feb. 29, 2008

(86) PCT No.: PCT/DE2008/000363
§ 371 (c)(1),
(2), (4) Date: Oct. 9, 2009

(87) PCT Pub. No.: WO2008/106941
PCT Pub. Date: Sep. 12, 2008

(65) Prior Publication Data
US 2010/0117103 A1    May 13, 2010

(30) Foreign Application Priority Data
Mar. 7, 2007  (DE) .................. 10 2007 011 123

(51) Int. Cl.
*H01L 33/00* (2010.01)

(52) U.S. Cl.
USPC .............. 257/91; 257/E33.067; 257/E21.211; 438/29

(58) Field of Classification Search
USPC ............... 257/91, E33.067, E21.211; 438/29
See application file for complete search history.

(56) References Cited

U.S. PATENT DOCUMENTS

| 4,074,299 | A |   | 2/1978 | Kusano et al. |
|-----------|---|---|--------|---------------|
| 5,291,038 | A | * | 3/1994 | Hanamoto et al. .............. 257/82 |
| 6,388,723 | B1 | * | 5/2002 | Iida et al. ..................... 349/111 |
| 7,759,754 | B2 | * | 7/2010 | Gunther et al. ............... 257/434 |
| 2006/0055309 | A1 |   | 3/2006 | Ono et al. |
| 2007/0190290 | A1 |   | 8/2007 | Gunther et al. |
| 2009/0103297 | A1 |   | 4/2009 | Bogner et al. |
| 2009/0127573 | A1 |   | 5/2009 | Guenther et al. |

FOREIGN PATENT DOCUMENTS

| DE | 31 29 967 A1 | 2/1983 |
| DE | 103 53 679 A1 | 6/2005 |
| DE | 10 2004 050 371 A1 | 4/2006 |
| DE | 10 2005 019 375 A1 | 9/2006 |
| JP | 60-253286 | 12/1985 |
| JP | 09-092885 | 4/1997 |
| JP | 2003031854 | * 1/2003 |

* cited by examiner

*Primary Examiner* — Minh-Loan T Tran
*Assistant Examiner* — Fazli Erdem
(74) *Attorney, Agent, or Firm* — Slater & Matsil, L.L.P.

(57) ABSTRACT

A light-emitting module includes a supporting element, a number of optoelectronic semiconductor components mounted on the supporting element for the generation of electromagnetic radiation, and a metallic connecting layer by means of which the optoelectronic semiconductor components are supplied with operating voltage. An insulation layer is arranged in a region of the optoelectronic semiconductor components between the supporting element and the metallic connecting layer. The metallic connecting layer forms a light shade for the optoelectronic semiconductor components, so that the electromagnetic radiation is only emitted in a specified direction.

24 Claims, 3 Drawing Sheets

LIGHT-EMITTING MODULE AND METHOD OF MANUFACTURE FOR A LIGHT-EMITTING MODULE

This patent application is a national phase filing under section 371 of PCT/DE2008/000363, filed Feb. 29, 2008, which claims the priority of German patent application 10 2007 011 123.3, filed Mar. 7, 2007, each of which is incorporated herein by reference in its entirety.

TECHNICAL FIELD

The invention relates to a light-emitting module, incorporating a supporting element, a number of optoelectronic semiconductor components mounted on the supporting element for the generation of electromagnetic radiation, and a metallic connecting layer by means of which the optoelectronic semiconductor components are supplied with an operating voltage.

The invention further relates to a method of manufacture for a light-emitting module.

BACKGROUND

A light-emitting module is, for example, known from German Patent Application DE 10 2005 019 375 A1, U.S. equivalent publication 2009/0103297. Such modules, having optoelectronic semiconductor components, are used in a large number of applications. In comparison with conventional means of lighting such as incandescent bulbs they feature a longer service life and a higher efficiency. It is, for instance, known that modules with particularly powerful LED components can be used as the front headlamps of a motor vehicle. Light-emitting modules are, however, also used as bright display elements.

SUMMARY

One problem with known light-emitting modules is that of restricting both lateral light leakage and optical crosstalk. Lateral light leakage refers here, in particular, to light being emitted from one semiconductor component owing to the unwanted influx of light radiation from a neighboring semiconductor component. This results, both in display units and in lighting equipment, in a reduction of the contrast or a weakening of the light-to-dark transition of an illuminated surface.

The lateral light leakage can be reduced by physical separation of the individual semiconductor components. As an alternative, it is also possible to locate additional optical elements in front of the individual components in order to achieve an improvement in the contrast. Arrangements that require physical separation of the individual semiconductor components, or the positioning of additional optical elements, are, however, relatively complex to manufacture and therefore involve increased costs.

In one aspect the present invention discloses a light-emitting module in which lateral light leakage is at least reduced. A further task is that of disclosing a method of manufacture for light-emitting modules with reduced lateral light leakage.

A light-emitting module of the type described herein, has an insulation layer positioned in a region of the optoelectronic semiconductor component between the supporting element and the metallic connecting layer, and the metallic connecting layer constitutes a light shade for the optoelectronic semiconductor components, so that the electromagnetic radiation is only radiated in a specified direction.

Through the provision and design of a metallic connecting layer on an insulating layer over the optoelectronic semiconductor components, the connecting layer can achieve a light shading effect. Since the connecting layer is usually located very close to the optoelectronic semiconductor component, a reduction in the lateral light leakage and an improvement in the contrast of the light-emitting module are achieved. As a result it is possible to omit supplementary elements located on top of the light-emitting module.

According to one favorable embodiment, a depression is made between two neighboring optoelectronic semiconductor components, and the depression is at least partially filled by the metallic connecting layer. Through the formation and filling of a depression between neighboring optoelectronic semiconductor components, lateral light leakage between neighboring components can be prevented.

According to a further favorable embodiment, the metallic connecting layer has first and second regions, the first region being designed to supply the optoelectronic component with its operating voltage, while the second region is designed to form light shading elements. By separating the metallic connecting layer into first and second regions, the first region, which carries the electrical power, can be made relatively small, in order to mitigate negative electrical effects such as, for instance, an increase in the capacitance of the conductor.

According to a further favorable implementation of the invention, the insulating layer comprises a photoluminescent conversion layer that absorbs electromagnetic radiation at a first wavelength and emits electromagnetic radiation at a second wavelength. By including a conversion layer in the insulation layer, the color temperature of the emitted electromagnetic radiation can be matched to the requirements of a specific application.

A manufacturing method for a light-emitting module includes the following steps:

providing multiple optoelectronic semiconductor components, placing the multiple optoelectronic semiconductor components on a supporting element, applying an insulation layer to a region of the optoelectronic semiconductor components on the supporting element, applying a metallic connecting layer onto the insulation layer to provide the optoelectronic semiconductor components with a supply voltage in such a way that at least one light shading element is formed in the metallic connecting layer that at least partially surrounds the optoelectronic semiconductor components.

Through the application of a metallic connecting layer to provide power to the optoelectronic semiconductor components, and which also acts as a light shade for the optoelectronic semiconductor components, the manufacturing process for the light-emitting module can be simplified. In particular, two functions, namely the creation of a contact and the application of light shades, are effected in a single stage of the process. It is therefore possible to omit the application of additional optical elements.

Further favorable embodiments of the invention are disclosed herein.

BRIEF DESCRIPTION OF THE DRAWINGS

The invention is explained in more detail below through examples of embodiments and with the aid of the figures.

DETAILED DESCRIPTION OF ILLUSTRATIVE EMBODIMENTS

Before describing the individual embodiments of the present invention, arrangements of known light-emitting modules will be described for the sake of better understanding.

Figure 6:
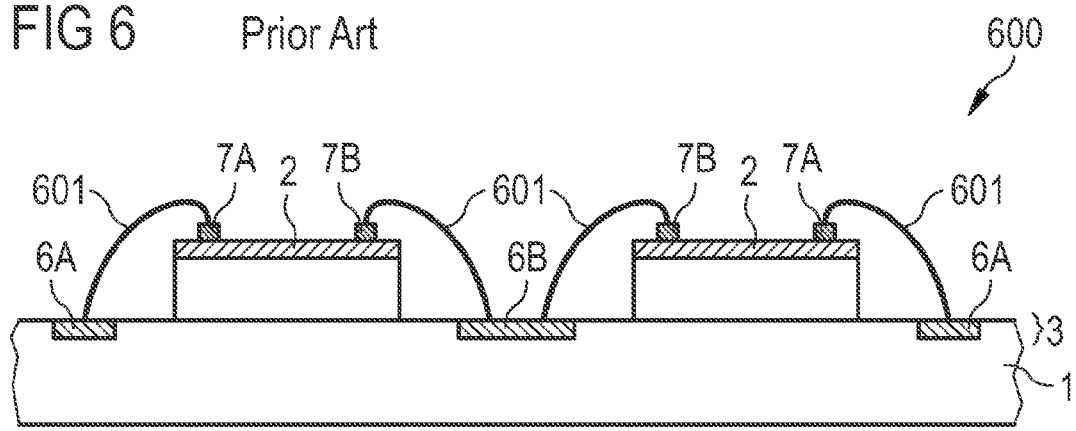
FIG. 6, shows a first arrangement according to the state of the art.

FIG. 6 shows a first arrangement 600 in which the two semiconductor components 2, surface-emitting light-emitting diodes (LEDs) in this example, are arranged on a common supporting element 1. A metallic connecting layer 3 in the form of first conductive tracks 6A and a second conductive track 6B is integrated into the supporting element 1. The conductive tracks 6A and 6B are connected via bonding wires 601 to the first and second contacts 7A and 7B of the semiconductor component 2.

In the first arrangement 600 according to FIG. 6, lateral light leakage between the semiconductor components 2 is not prevented. Through the use of surface-emitting semiconductor components 2 it is true that a high proportion of the electromagnetic radiation emitted from the components 2 is emitted upwards or downwards, so that unwanted coupling between components 2 that are positioned next to one another is relatively small, but full suppression of this effect and the loss of contrast that is associated with it is, however, not possible. The first arrangement illustrated in FIG. 6 is, moreover, relatively mechanically delicate, which means that the individual semiconductor components usually have to be enclosed in a protective housing.

Figure 7:
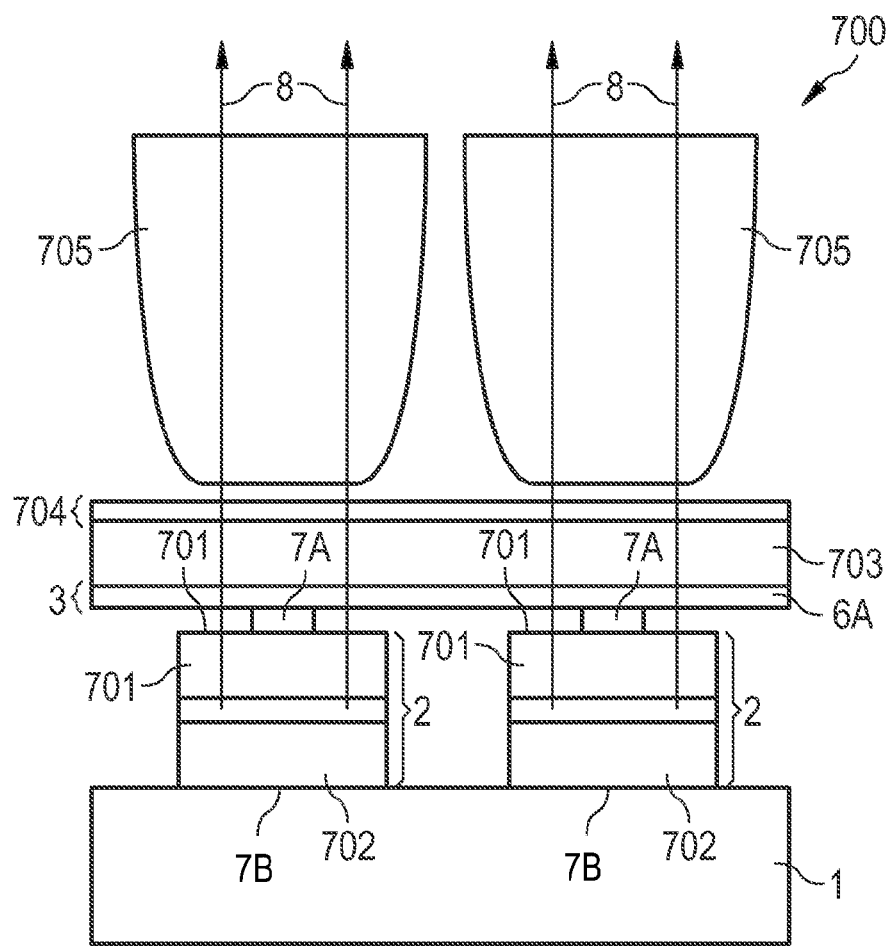
FIG. 7, shows a second arrangement according to the state of the art.

FIG. 7 illustrates an improved second arrangement 700 of a light-emitting module. Two semiconductor components 2 are mounted on a supporting element 1. In this example, these are semiconductor chips, each having a first contact 7A at a surface 701 from which radiation emerges, and a second contact 7B at a base surface 702 that is electrically connected to the supporting element 1. A covering body 703, on the bottom of which a connecting layer 3 in the form of a conductive track 6A is arranged, is positioned over the semiconductor components 2. The conductive track 6A consists of a transparent, conductive material, and supplies operating electrical power through the first contact 7A to the semiconductor component 2.

In addition, a layer 704 containing at least one luminescence conversion material applied on top of the covering body 703. Optical elements 705 are provided on top of this, and bundle the electromagnetic radiation in accordance with the requirements of an application. In the second arrangement 700, it is again not possible to prevent lateral light leakage reaching the individual semiconductor components 2.

Figure 1:
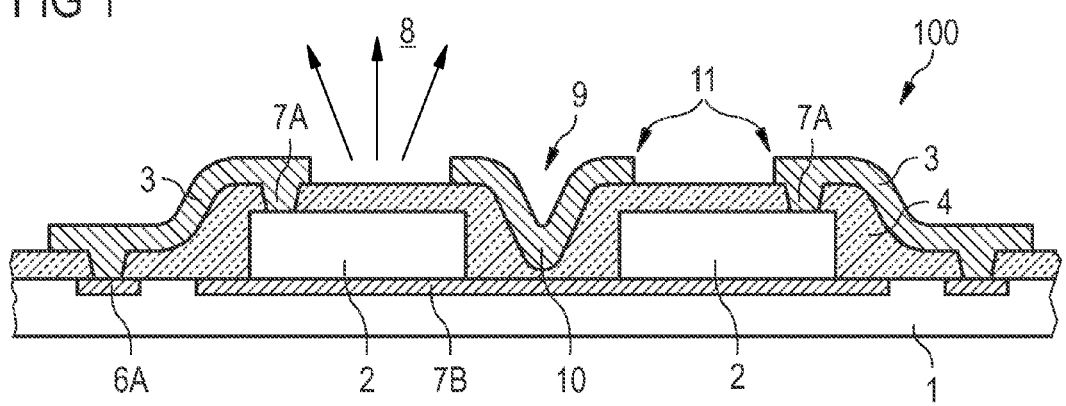
FIG. 1, shows a schematic cross-sectional drawing according to a first embodiment.

FIG. 1 illustrates a first light-emitting module 100, in which two semiconductor components 2 are positioned on a common carrier element 1. The semiconductor components 2 in the first embodiment are what is known as volume emitters, in which electromagnetic radiation 8, particularly in the form of light, is generated within the entire volume of the semiconductor component 2. In this application, electromagnetic radiation 8 also includes such radiation outside the visible range of wavelengths, i.e., in particular, also infrared, ultraviolet and x-ray radiation.

The creation of photons through the combination of minority and majority carriers within the semiconductor component 2 is at first isotropic, which means that electromagnetic radiation 8 can be emitted in any possible direction. The supporting element 1 acts as a mirror in order to bundle the electromagnetic radiation 8 from the light-emitting module 100 into one emitting direction. For example, the carrier element 1 can comprise a metallic material in the region of the semiconductor component 2.

An insulating layer 4 is located on top of the semiconductor components 2. An additional metal connecting layer 3 is located on top of this. The insulating layer 4 is located in a region that surrounds the semiconductor component 2, and has the effect in this embodiment of electrically separating the connecting layer 3 from both the supporting element 1 and from the semiconductor components 2, in particular from their lateral faces. The insulating layer 4 is, however, interrupted in a connecting region in which there is electrical contact between the connecting layer 3 and a conductive track 6A that is integrated into the supporting element 1.

If an electrical voltage is supplied to the connecting layer 3 from above or along any route other than the supporting element, the insulating layer does not need to have any interruptions. Conversely the insulating layer 4 can be interrupted at the edges of the semiconductor components 2 if it is intended to supply operating power through a lateral face. It may also be possible to entirely omit an insulating layer 4 away from the optoelectronic components 2 if the supporting element 1 itself consists of a non-conductive material such as ceramic, plastic or an uncoated circuit board.

A first contact 7A for powering the semiconductor components 2 is created through the connecting layer 3. Here, the connecting layer 3 also acts as a reflector, returning electromagnetic radiation 8 that is emitted from the side of the semiconductor component 2. A second contact 7B for the semiconductor components 2 is provided, in this embodiment, directly via the supporting element 1.

In the light-emitting module 100 shown in FIG. 1, the semiconductor component 2 on the left is contacted from the left, while the right-hand semiconductor component 2 is contacted from the right. A depression 9 is located between the two semiconductor components 2, and is filled with a light shading element 10. The light shading element 10 can be an opaque layer of the same material of which the connecting layer 3 is made, or may alternatively comprise some other opaque material. The light shading element 10 does not have to be electrically connected to the other parts of the connecting layer 3. It may, instead, be connected to a ground potential, or may not be connected to any particular defined electrical potential.

The connecting layer 3 on one side of the semiconductor components 2 and the light shading element 10 on the other side of the semiconductor components 2 prevent lateral light leakage from passing between neighboring semiconductor components 2. Because the electromagnetic radiation 8 can only escape upwards, the radiation generated by the semiconductor components 2, which is initially isotropic, is bundled together by reflection to travel in one direction. The connecting layer 3 and the light shading element 10 thus work together in order to create a sharply limited aperture opening 11.

The aperture opening 11 can be projected by means of appropriate optical elements onto a surface that is to be illuminated. It is advantageous here that, due to the compact construction of the light-emitting module 100, such optical elements can be positioned very close to the semiconductor components 2. In this way, if the light-emitting module 100 is, for instance, employed in the front headlamp of a motor vehicle, a sharp transition between bright and dark can be achieved, and this results in improved perception on the part of a driver.

Figure 2:
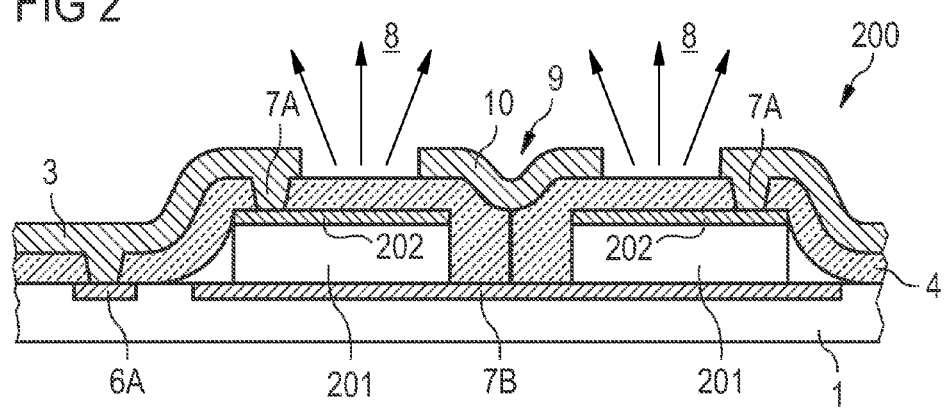
FIG. 2, shows a schematic cross-sectional drawing of a second embodiment.

FIG. 2 illustrates a second light-emitting module 200, constructed in a manner similar to the light-emitting module 100. In contrast to the light-emitting module 100, the semiconductor components 2 are implemented as surface radiators. Specifically, the semiconductor components 2 comprise an optically passive substrate 201 as well as an optically active layer 202 into which a p-n junction is integrated. Electromagnetic radiation 8 is only generated in the region of the optically active layer 202. For this reason, lateral light leakage between the semiconductor components 2 in the light-emitting module 200 can be reduced through a light shading element 10 that only penetrates into a depression 9 between neighboring semiconductor components 2 to a depth equivalent to that of the optically active layer 202.

An arrangement according to FIG. 2 is particularly favorable when semiconductor components 2 are located very close to one another, or when the insulation layer 4 is very thin. The insulating layer 4 can, for instance, be a transparent plastic film or of silicone. In one favorable implementation, a photoluminescent conversion layer is integrated into the insulating layer or is applied to it; this absorbs, at least partially, the electromagnetic radiation 8 at a first wavelength or in a first spectrum, blue light for instance, and emits electromagnetic radiation 8 at a second wavelength or in a second spectrum, such as white light.

Figure 3:
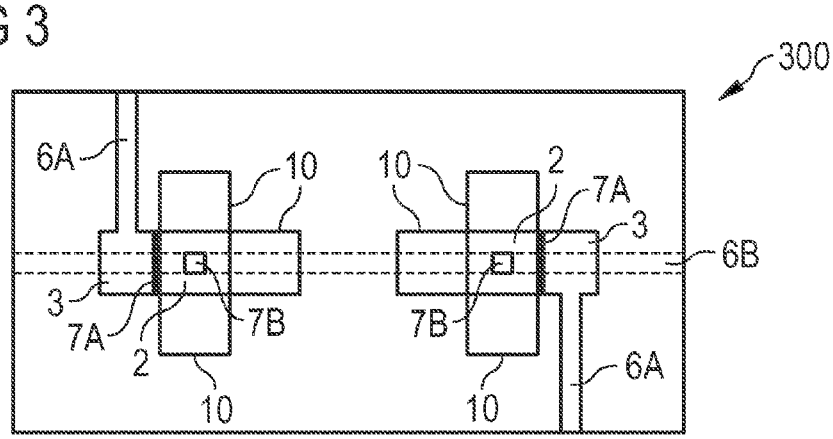
FIG. 3, shows a view from above of a third embodiment.

FIG. 3 illustrates a view from above according to a third embodiment of a light-emitting module 300. Two semiconductor components 2 are positioned on a supporting element 1 and are supplied with operating power through first conductive tracks 6A on the top of the supporting element 1 and a second conductive track 6B on the lower side of the supporting element 1. For this reason, first contacts 7A are formed on the first conductive tracks 6A, and these make a first electrical contact with the semiconductor components 2. A second electrical contact 7B is made from the underside of the semiconductor components 2.

The first conductive tracks 6A with the first contacts 7A are located in a first connecting layer 3 that is positioned on top of the supporting element 1 and that rises above it. The first contacts 7A of the connecting layer 3 thus create a boundary for the semiconductor components 2 in a first direction. Additional light shading elements 10, also raised, are arranged in the other three directions around the semiconductor components 2 in the plane of the connecting layer 3. The light shading elements 10 are also integrated into the connecting layer 3, and can consist of the same material or of another non-transparent material.

Figure 4:
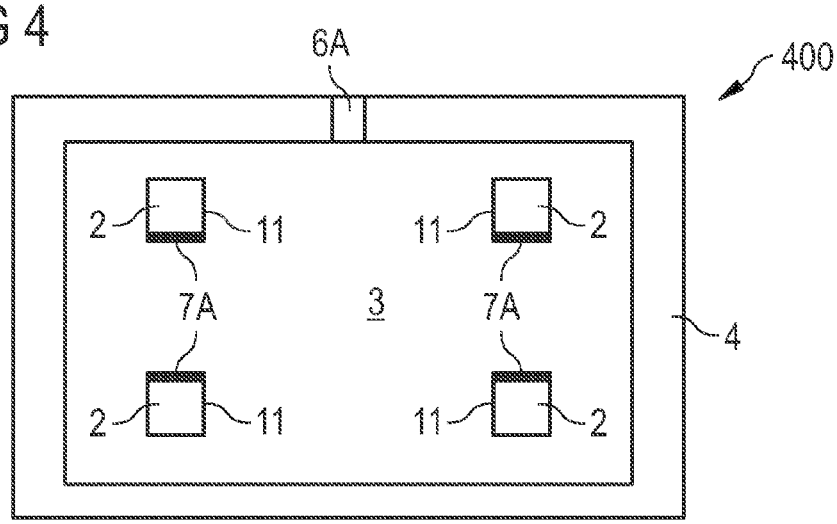
FIG. 4, shows a view from above according to a fourth embodiment.

FIG. 4 illustrates a further embodiment of a light-emitting module 400. In the embodiment of FIG. 4, four semiconductor components 2 are arranged in the form of a two-dimensional array. In the embodiment according to FIG. 4, the semiconductor components 2 are fully enclosed by raised first contacts 7A. The contacts 7A make an electrical connection to a first electrically conductive track 6A through which the semiconductor components 2 are supplied with operating electrical voltage. On the underside of the semiconductor components 2 there are again second contacts 7B that make the connection to a supporting element 1. These are not, however, illustrated in FIG. 4.

The first contacts 7A are located in a connecting layer 3, and act at the same time as light shading elements 10 that prevent the lateral emergence of radiation from the semiconductor components 2. In this way, the outline of a surface illuminated by the light-emitting module 400 can be determined by the form of the aperture opening 11 integrated into the first contact 7A. The connecting layer 3 is located on top of an insulating layer 4 that electrically separates the connecting layer 3 from the supporting element 1, which is not illustrated.

Figure 5:
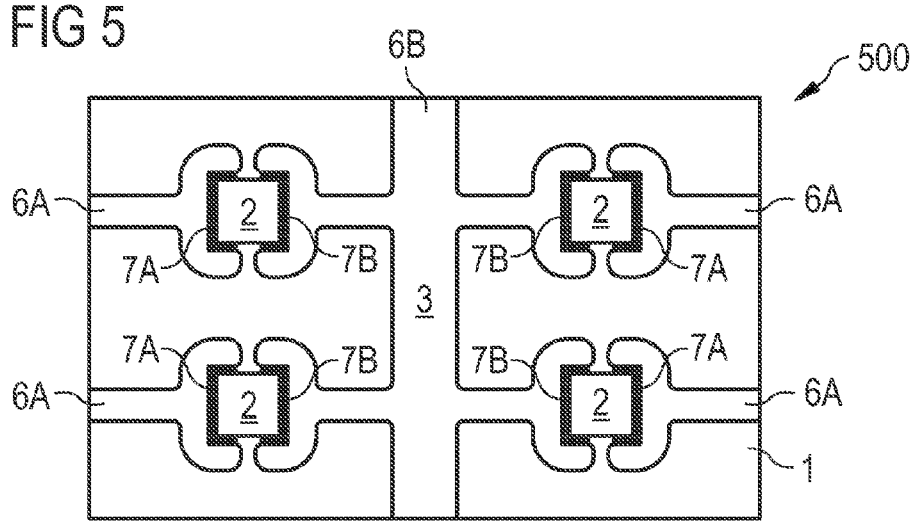
FIG. 5, shows a view from above of a fifth embodiment.

FIG. 5 illustrates a fifth embodiment of a light-emitting module 500, in which first contacts 7A and second contacts 7B are formed in a connecting layer 3 on the top side of a semiconductor component 2 positioned on a supporting element 1. The semiconductor components 2 can, for instance, be surface radiators in which the connections to a p-n junction are both located on the surface of the semiconductor component 2. The first contact 7A and the second contact 7B each form one half of a hemisphere surrounding the semiconductor component 2. In this way it is again possible for the electromagnetic radiation 8 emitted from the semiconductor components 2 of the light-emitting module 500 to emerge only upwards from the plane of the illustration. A common supporting element 1 acts as a reflector or absorber for radiation going downwards.

The invention is not restricted to the description that refers to the example embodiments. The invention, rather, comprises every new feature and every combination of features, and in particular any combination of features in the patent claims, even if this feature or this combination itself is not explicitly described in the patent claims or in the example embodiments.

The invention claimed is:

1. A light-emitting module comprising:
a supporting element;
a plurality of optoelectronic semiconductor components for generation of electromagnetic radiation arranged on the supporting element; and
a metallic connecting layer coupled to supply the optoelectronic semiconductor components with operating voltage, wherein the metallic connecting layer constitutes a light shade for the optoelectronic semiconductor components, as a result of which the electromagnetic radiation is only emitted in a specified direction;
an insulation layer arranged in a region of the optoelectronic semiconductor components between the supporting element and the metallic connecting layer; and
a depression located between two neighboring optoelectronic semiconductor components which is filled with a light shading element, wherein the light shading element is formed by an opaque layer that is not electrically connected to the metallic connecting layer, and wherein the opaque layer and the metallic connecting layer contact the insulation layer and are arranged on the insulation layer.

2. The light-emitting module according to claim 1, wherein the depression extends through the full height of the optoelectronic semiconductor components.

3. The light-emitting module according to claim 1, wherein the metallic connecting layer comprises a first connecting facility, and the supporting element comprises a second connecting facility to supply multiple optoelectronic semiconductor components with the operating voltage.

4. The light-emitting module according to claim 1, wherein the optoelectronic semiconductor components comprise luminescent diodes.

5. The light-emitting module according to claim 1, wherein the optoelectronic semiconductor components comprise surface radiators.

6. The light-emitting module according to claim 1, wherein the plurality of optoelectronic semiconductor components are arranged in an array.

7. The light-emitting module according to claim 1, wherein the insulating layer comprises a photoluminescent conversion layer that absorbs electromagnetic radiation at a first wavelength and emits electromagnetic radiation at a second wavelength.

8. A method of manufacturing a light-emitting module, the method comprising:
providing a plurality of optoelectronic semiconductor components,
placing the optoelectronic semiconductor components on a supporting element,
forming an insulation layer at a region of the optoelectronic semiconductor components on the supporting element, wherein forming the insulation region comprises forming depressions between neighboring optoelectronic semiconductor components; and
forming a metallic layer over the insulation layer, the metallic layer including a first portion configured to provide the optoelectronic semiconductor components with a supply voltage and a second portion that is located in the depressions, wherein the second portion of the metallic layer is not electrically connected to the first portion of the metallic layer and wherein the first and second portions of the metallic layer together create aperture openings that at least partially surround the optoelectronic semiconductor components and serve as a light shade for the optoelectronic semiconductor components such that each semiconductor component emits electromagnetic radiation in only a specified direction.

9. The method according to claim 8, further comprising:
forming a first electrical contact when the optoelectronic semiconductor components are arranged on the supporting element and then forming a second electrical contact to the optoelectronic semiconductor components when the metallic connecting layer is applied.

10. The light-emitting module according to claim 4, wherein the optoelectronic semiconductor components comprise light-emitting diodes.

11. The light-emitting module according to claim 4, wherein the optoelectronic semiconductor components comprise organic light-emitting diodes.

12. The light-emitting module according to claim 1, wherein the depression extends to about a level of an upper surface of the optoelectronic semiconductor components.

13. The light emitting diode according claim 1, wherein the metallic connecting layer and the light shading element together create an aperture opening.

14. The method according to claim 8, wherein the depressions extend through the full height of the optoelectronic semiconductor components.

15. The method according to claim 8, wherein the depressions extend to about a level of an upper surface of the optoelectronic semiconductor components.

16. The method according to claim 8, wherein the optoelectronic semiconductor components comprise luminescent diodes.

17. The method according to claim 16, wherein the optoelectronic semiconductor components comprise light-emitting diodes.

18. The method according to claim 16, wherein the optoelectronic semiconductor components comprise organic light-emitting diodes.

19. The method according to claim 8, wherein the optoelectronic semiconductor components comprise surface radiators.

20. The method according to claim 8, wherein the insulation layer comprises a photoluminescent conversion layer that absorbs electromagnetic radiation at a first wavelength and emits electromagnetic radiation at a second wavelength.

21. The method according to claim 8, wherein the first portion is laterally adjacent the second portion in a same level above the insulation layer, and wherein the first portion and the second portion contact the insulation layer.

22. A light-emitting module comprising:
a supporting element;
a plurality of optoelectronic semiconductor components disposed on the supporting element;
an insulation layer disposed over the optoelectronic semiconductor components;
a supply connection disposed on the insulation layer, wherein the supply connection is coupled to the optoelectronic semiconductor components, and wherein the supply connection is configured as a reflector of light and to supply the optoelectronic semiconductor components with an operating voltage;
a depression in the insulation layer located between two neighboring optoelectronic semiconductor components; and
a light shading element disposed in the depression and on the insulation layer, wherein the light shading element comprises an opaque layer that is not electrically connected to the supply connection, and wherein the light shading element and the supply connection are disposed at a same level and in contact with the insulation layer.

23. The light-emitting module of claim 22, wherein the supply connection and the light shading element are located on opposite sides of each of plurality of optoelectronic semiconductor components.

24. The light-emitting module of claim 23, wherein the plurality of optoelectronic semiconductor components comprise a first optoelectronic semiconductor component and a second optoelectronic semiconductor component, wherein the first optoelectronic semiconductor component is coupled to the supply connection, wherein the first optoelectronic semiconductor component is coupled to another supply connection electrically isolated from the light shading element, wherein the light shading element is disposed between the first and the second optoelectronic semiconductor components, and wherein the light shading element is configured to prevent light from entering into a region of the first optoelectronic semiconductor component and a region of the second optoelectronic semiconductor component.

* * * * *

UNITED STATES PATENT AND TRADEMARK OFFICE
CERTIFICATE OF CORRECTION

PATENT NO.          : 8,546,826 B2                                          Page 1 of 1
APPLICATION NO.  : 12/529137
DATED               : October 1, 2013
INVENTOR(S)       : Marfeld et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 122 days.

Signed and Sealed this

Fifteenth Day of September, 2015

Michelle K. Lee
*Director of the United States Patent and Trademark Office*